United States Patent [19]

Kamide

[11] Patent Number: 5,306,379
[45] Date of Patent: Apr. 26, 1994

[54] DRY ETCHING APPARATUS FOR RECTANGULAR SUBSTRATE COMPRISING PLASMA BAR GENERATION MEANS

[75] Inventor: Yukihiro Kamide, Kanagawa, Japan
[73] Assignee: Sony Corporation, Tokyo, Japan
[21] Appl. No.: 937,673
[22] Filed: Sep. 1, 1992
[30] Foreign Application Priority Data
  Sep. 3, 1991 [JP] Japan .................. 3-252934
[51] Int. Cl.$^5$ .............................. H01L 21/00
[52] U.S. Cl. .................. 156/345; 156/643; 204/298.37; 204/298.38
[58] Field of Search ............ 156/345, 643; 118/723, 118/723 MR, 723 MA, 723 E, 723 ER; 204/298.31, 298.34, 298.37, 298.38

[56] References Cited

U.S. PATENT DOCUMENTS 4,745,337  5/1988  Pichot et al. ............ 204/298.38 X
4,996,077  2/1991  Moslehi et al ............ 118/719 X

OTHER PUBLICATIONS

Burke et al., "Microwave Multipolar Plasma for Etching and Deposition", *Solid State Technology*, Feb. 1988, pp. 67–71.

*Primary Examiner*—Brian E. Hearn
*Assistant Examiner*—Jonathan D. Baskin
*Attorney, Agent, or Firm*—Hill, Steadman & Simpson

[57] ABSTRACT

A rectangular substrate dry etching apparatus which etches a rectangular substrate of a large size with a high degree of accuracy. The dry etching apparatus comprises an etching chamber in which a rectangular substrate to be etched is held in position in the etching chamber, and a plasma generator disposed in the etching chamber for generating a pair of high density plasma bars on the outer sides of and substantially in parallel to a pair of opposing sides of the rectangular substrate in the etching chamber so as to etch the rectangular substrate with diffusion components of the high density plasma bars.

10 Claims, 4 Drawing Sheets

DRY ETCHING APPARATUS FOR RECTANGULAR SUBSTRATE COMPRISING PLASMA BAR GENERATION MEANS

BACKGROUND OF THE INVENTION

1. Field of the Invention

This invention relates to a rectangular substrate dry etching apparatus for etching a rectangular substrate of a large size principally for use with a field emission display or a liquid crystal display.

2. Description of the Prior Art

When a rectangular substrate of a large size for use with a field emission display or a liquid crystal display is to be worked finely by dry etching, a dry etching apparatus for the fabrication of ordinary semiconductor devices having a large etching chamber is employed.

As such dry etching apparatus, an ordinary plasma etching apparatus of the parallel flat plate type, a magnetron plasma etching apparatus, an electronic cyclotron resonance (hereinafter referred to briefly as ECR) plasma etching apparatus or the like is employed.

Also a distribution ECR (hereinafter referred to briefly as DECR) plasma etching apparatus is employed frequently. General structure of an exemplary one of conventional DECR plasma etching apparatus is schematically shown in FIGS. 4 and 5. Referring to FIGS. 4 and 5, microwaves of a frequency of 2.45 GHz generated by a magnetron oscillator 51 are transmitted by way of a waveguide 52 to a splitter 53, at which they are distributed into a plurality of coaxial cables 54. The microwaves thus distributed propagate along the coaxial cables 54 and are radiated from a plurality of bar-like antennae 56 disposed along an inner side wall of an etching chamber 55. High density plasma 63 is generated at a position spaced from a rectangular substrate 74 by the microwaves 61 radiated from the bar-like antennae 56 and a magnetic field 62 (magnetic flux density of 875 Gauss) satisfying an ECR requirement. The rectangular substrate 74 is etched with diffusion plasma 64 consisting of diffusion components of the high density plasma 63.

With a plasma etching apparatus of the parallel flat plate type, however, a rectangular substrate to be worked is liable to be damaged. If the bias current to be applied to a rectangular substrate is decreased in order to reduce damage, the etching rate is reduced and the etching uniformity is deteriorated.

Meanwhile, with an ECR plasma etching apparatus, it is difficult to generate plasma of a large diameter uniformly such that it completely covers a rectangular substrate. Consequently, the etching uniformity is low.

On the other hand, with such a DECR plasma etching apparatus as described above, a sufficiently high microwave power cannot be propagated because microwaves distributed by a splitter are propagated to antennae by way of coaxial cables. Consequently, the etching rate is low and much time is required for etching. If the size of the rectangular substrate increases, then the etching rate decreases as much.

Accordingly, whichever one of such conventional dry etching apparatus is used, it is difficult to etch a rectangular substrate of a large size with a high degree of accuracy.

SUMMARY OF THE INVENTION

It is an object of the present invention to provide a rectangular substrate dry etching apparatus which etches a rectangular substrate of a large size with a high degree of accuracy.

In order to attain the object, according to the present invention, there is provided a dry etching apparatus for dry etching a rectangular substrate, which comprises an etching chamber, means for holding a rectangular substrate to be etched in position in the etching chamber, and a plasma generator disposed in the etching chamber for generating a pair of high density plasma bars on the outer sides of and substantially in parallel to a pair of opposing sides of the rectangular substrate in the etching chamber so as to etch the rectangular substrate with diffusion components of the high density plasma bars.

With the rectangular substrate dry etching apparatus, since the plasma generator for generating a pair of high density plasma bars on the outer sides of and substantially in parallel to a pair of opposing sides of the rectangular substrate in the etching chamber is disposed in the etching chamber, diffusion plasma formed from diffusion components of the high density plasma such as diffusion charged particles and radicals presents a uniform density distribution above the rectangular substrate. Consequently, enhancement of the uniformity in etching is achieved, and etching with a high degree of accuracy can be performed.

Further, since the high density plasma is generated on the outer sides of the rectangular substrate, it does not contact directly with the rectangular substrate. Consequently, the rectangular substrate will not likely suffer from etching damage.

Besides, since high density plasma can be generated with stability in an etching ambient atmosphere of a low pressure, a sufficiently high etching rate can be achieved.

Accordingly, a rectangular substrate of a large size can be etched with a high degree of accuracy at a high etching rate.

The above and other objects, features and advantages of the present invention will become apparent from the following description and the appended claims, taken in conjunction with the accompanying drawings.

DETAILED DESCRIPTION OF THE PREFERRED EMBODIMENTS

Figure 1:
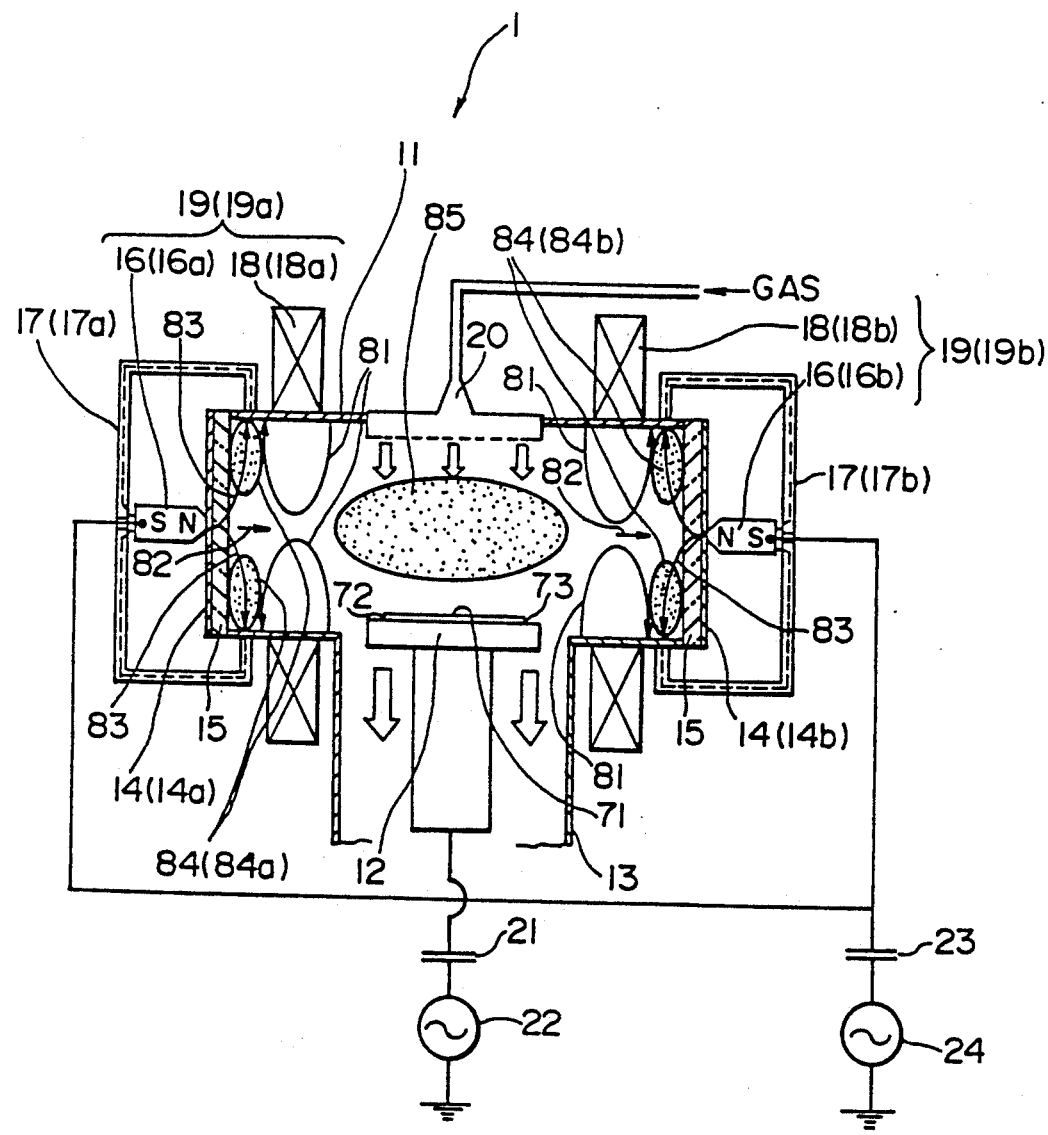
FIG. 1 is a schematic sectional view of a rectangular substrate dry etching apparatus showing a first preferred embodiment of the present invention.
Figure 2:
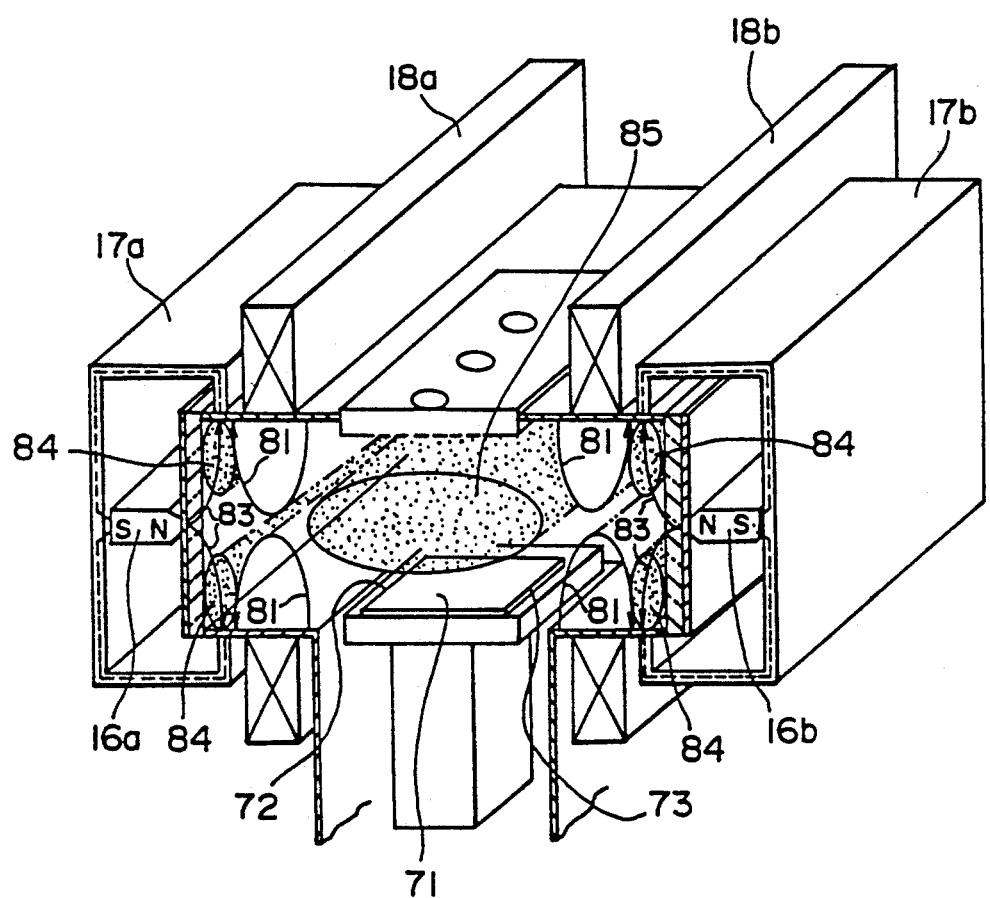
FIG. 2 is a schematic view, partly in section, of the rectangular substrate dry etching apparatus of FIG. 1.

Referring first to FIGS. 1 and 2, there is shown a rectangular substrate dry etching apparatus to which the present invention is applied. The rectangular substrate dry etching apparatus shown is formed as a magnetron etching apparatus of the compressing magnetic field type.

The rectangular substrate dry etching apparatus is generally denoted at 1 and has an etching chamber 11 in the form of a parallelepiped box. A susceptor 12 for holding a rectangular substrate 71 thereon by means of an electrostatic chuck (not shown) is disposed in the etching chamber 11. An exhaust pipe 13 is connected to a bottom wall of the etching chamber 11.

An insulating plate 15, which may be, for example, a quartz glass plate, is provided on the inner face of each of a pair of side walls 14 (14a and 14b) of the etching chamber 11. A pair of magnets 16 (16a and 16b) are disposed on the outer sides of the side walls 14a and 14b, respectively, and extend in a depthwise direction of the side walls 14a and 14b. Each of the magnets 16 may be an ordinary permanent magnet having a length greater then the depthwise dimension of the side walls 14a and 14b and is disposed such that it has the N pole adjacent the etching chamber 11.

A pair of permeable members 17 (17a and 17b) are provided for the side walls 14a and 14b of the etching chamber 11 in such a manner that they surround the side wall 14a and magnet 16a and the side wall 16b and magnet 16b, respectively. The permeable members 17 are made of a material having a high permeability such as cobalt ferrite or magnetite.

A pair of solenoid coils 18 (18a and 18b) are provided on outer peripheral portions of the etching chamber 11 adjacent the side walls 14a and 14b such that they surround the top and bottom walls of the etching chamber 11 and extend substantially in parallel to the opposite sides 72 and 73 of the rectangular substrate 71. Each of the solenoid coils 18 generates magnetic fluxes in a direction opposite to the polarity of the corresponding magnet 16, that is, in the direction indicated by an arrow mark. The side walls 14a and 14b are made of a material having a low permeability and a low electric resistance such as, for example, aluminum.

Thus, a plasma generator 19 (19a) is constituted from the solenoid coil 18a and the magnet 16a, and another plasma generator 19 (19b) is constituted from the solenoid coil 18b and the magnet 16b.

A gas nozzle shower 20 for introducing etching gas into the etching chamber 11 is provided on the top wall of the etching chamber 11.

An ordinary load locking chamber (not shown) is provided adjacent a front wall (not shown) of the etching chamber 11 by way of an ordinary gate valve (not shown).

A bias applying high frequency power source 22 is connected to the susceptor 12 by way of a blocking capacitor 21. When a bias voltage is to be applied to the rectangular substrate 71, impedance matching is established.

A plasma generating high frequency power source 24 is connected to the side walls 14 by way of the magnets 16 and a blocking capacitor 23.

Subsequently, generation of plasma by the magnetron etching apparatus of the compressing magnetic field type of the construction described above will be described.

The inner faces of the side walls 14 of the etching chamber 11 are covered over a wide range with magnetic fluxes 81 generated by the solenoid coils 18. A high frequency of 13.56 MHz is supplied from the plasma generating high frequency power source 24 to the side walls 14 to cause discharge. Consequently, secondary electrons are trapped by magnetic fluxes 83 perpendicular to an electric field 82 so that high density plasma bars 84 (84a, 84b) are generated along the side walls 14a and 14b. Thereupon, the magnetic fluxes 83 generated from the N poles of the magnets 16 pass through the insides of the permeable members 17 and reach the S poles of the original magnets 16. Consequently, the magnetic fluxes 83 will not diverge.

Diffusion plasma 85 is generated by the high density plasma 84 generated in such a manner as described above such that it covers over the surface of the substrate 71. The diffusion plasma 85 is formed from diffusion components of the high density plasma 84 such as diffusion charged particles and radicals. A high frequency of 2 MHz is applied from the bias applying high frequency power source 22 to the rectangular substrate 71 so that charged particles in the diffusion plasma 85 are attracted to the rectangular substrate 71 thereby to effect anisotropic etching of the rectangular substrate 71.

In this instance, since the magnetic fluxes 84 perpendicular to the electric field 82 form a so-called cusp magnetic field over a wide area of the side walls 14a and 14b, a high ion current value is obtained.

Further, since the plasma generating high frequency power source 24 and the bias generating high frequency power source 22 are independent of each other, the controllability of etching is high. Consequently, etching can be performed at a high selectivity ratio at a high etching rate. Besides, even if the pressure of the etching ambient atmosphere in the etching chamber 11 is low, the high density plasma 84 can be generated with stability.

In addition, since the high density plasma 84 does not contact directly with the rectangular substrate 71, no etching damage is provided to the rectangular substrate 71.

It is to be noted that the gate valve for the transportation of wafer therethrough is provided at the front wall of the etching chamber 11 at which the ECR discharge mechanism is not provided so that a substrate to be etched can be loaded into and unloaded from the etching chamber 11 from and to the atmospheric air by way of the load locking chamber.

Exemplary processing conditions when various thin films are etched with the rectangular substrate dry etching apparatus 1 described above will be described subsequently.

When, for example, a thin film of polycrystalline silicon is to be etched, etching gas, which is a mixture of hydrogen bromide (HBr) of the flow rate of 70 sccm and sulfur hexafluoride ($SF_6$) of the flow rate of 30 sccm, is supplied into the etching chamber 11 so that the pressure in the etching chamber 11 is kept at 0.13 Pa. Then, a plasma generating power of 4 kW and a bias generating power of 20 W are applied.

On the other hand, when, for example, a thin film of silicon dioxide ($SiO_2$) is to be etched, etching gas, which is a mixture of tricarbon hexafluoride ($C_3F_6$) of the flow rate of 46 sccm and methylene difluoride ($CH_2F_2$) of the flow rate of 20 sccm, is supplied into the etching chamber 11 so that the pressure in the etching chamber 11 is kept at 0.13 Pa. Then, a plasma generating power of 4 kW and a bias generating power of 50 W are applied.

Or else, when a thin film of an aluminum metal is to be etched, etching gas, which is a mixture of boron chloride ($BCl_3$) of the flow rate of 30 sccm, chlorine ($Cl_2$) of the flow rate of 20 sccm and hydrogen chloride (HCl) of the flow rate of 50 sccm, is supplied into the etching chamber 11 so that the pressure in the etching chamber 11 is kept at 0.13 Pa. Then, a plasma generating power of 4 kW and a bias generating power of 30 W are applied.

Figure 3:
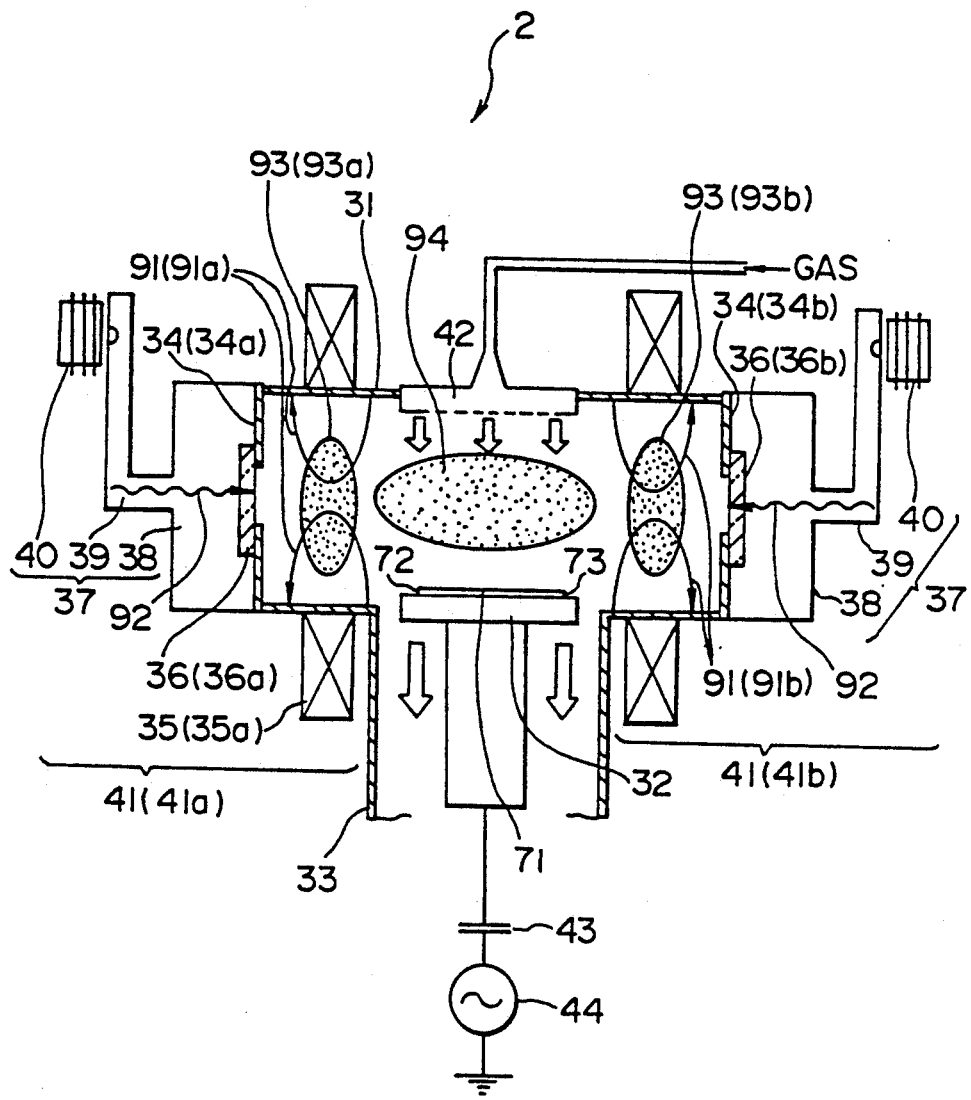
FIG. 3 is a schematic sectional view of another rectangular substrate dry etching apparatus showing a second preferred embodiment of the present invention.
Figure 4:
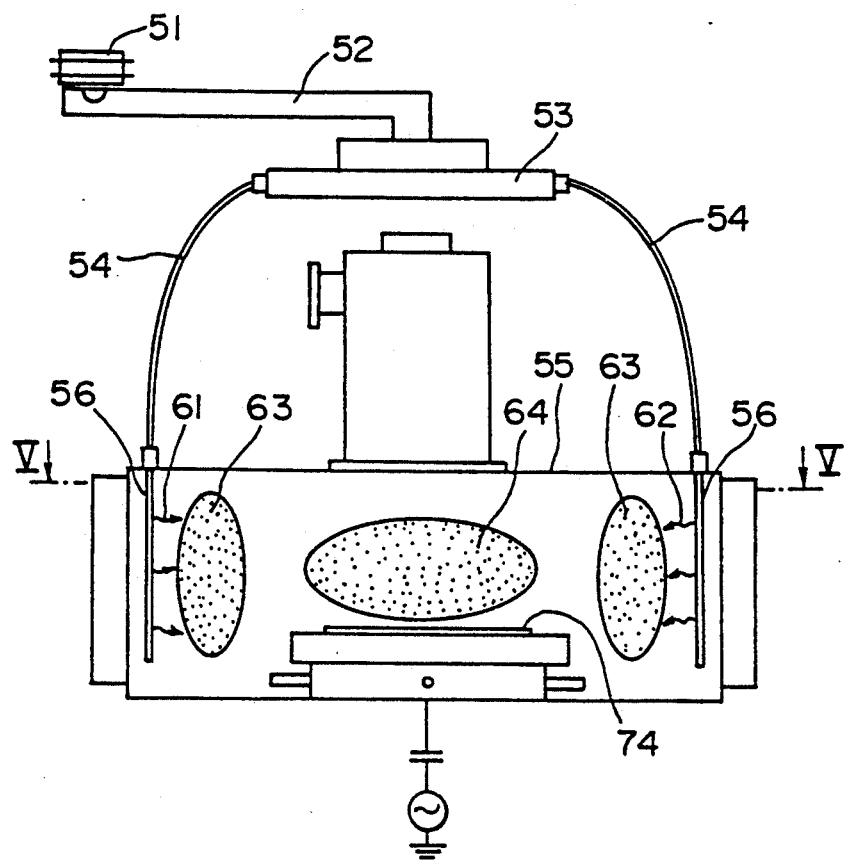
FIG. 4 is a schematic sectional view of a conventional rectangular substrate dry etching apparatus.
Figure 5:
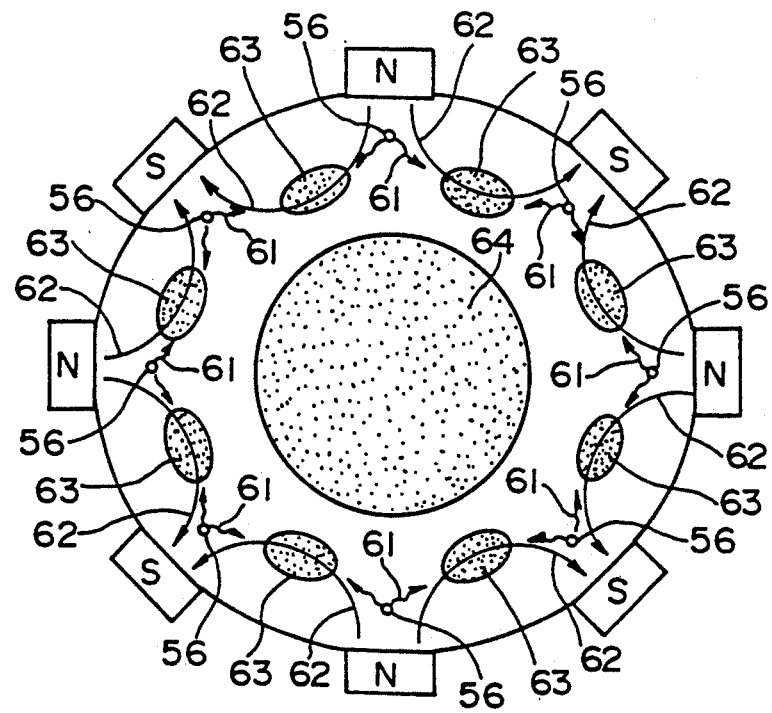
FIG. 5 is a sectional view taken along line V—V of FIG. 4.

Referring now to FIG. 3, there is shown another rectangular substrate dry etching apparatus to which the present invention is applied. The rectangular substrate dry etching apparatus shown is formed as an ECR plasma etching apparatus.

The rectangular substrate dry etching apparatus is generally denoted at 2 and has an etching chamber 31 in the form of a parallelepiped box. An ordinary susceptor 32 is disposed in the etching chamber 31 and holds a rectangular substrate 71 thereon by means of an electrostatic chuck (not shown). An exhaust pipe 33 is connected to the bottom wall of the etching chamber 31 around the susceptor 32.

A pair of solenoid coils 35 (35a and 35b) are provided on outer peripheral portions of the etching chamber 31 adjacent a pair of opposing side walls 34a and 34b of the etching chamber 31 such that they surround the top and bottom walls of the etching chamber 31 and extend substantially in parallel to the opposite sides 72 and 73 of the rectangular substrate 71. Each of the solenoid coils 35 generates a magnetic field 91 (91a, 91b) in the direction indicated by an arrow mark.

A pair of quartz glass windows 36a and 36b are formed in the side wales 34a and 34b of the etching chamber 31, respectively. A pair of microwave supplying sections 37 are provided on the outer sides of the quartz glass windows 36a and 36b. Each of the microwave supplying sections 37 includes a cavity resonator 38 provided on the outer side of the quartz glass window 36a or 36b, and a microwave oscillator 40 connected to the cavity resonator 38 by way of a waveguide 39. The cavity resonators 38 are formed with a length equal to the depthwise dimension of the side walls 34a and 34b of the etching chamber 31.

A plasma generator 41 (41a) is constituted from the solenoid coil 35a and the corresponding microwave supplying section 37, and another plasma generator 41 (41b) is constituted from the solenoid coil 35b and the corresponding microwave supplying section 37.

A gas nozzle shower 42 for introducing etching gas into the etching chamber 31 is provided on the top wall of the etching chamber 31.

An ordinary load locking chamber (not shown) is provided adjacent a front wall (not shown) of the etching chamber 31 by way of an ordinary gate valve (not shown).

A high frequency power source 44 is connected to the susceptor 32 by way of a blocking capacitor 43.

Subsequently, generation of plasma by the rectangular substrate dry etching apparatus 2 of the construction described above will be described.

Microwaves (2.45 GHz) 92 generated from the magnetron generators 40 are transmitted to the cavity resonators 38 by way of the waveguides 39. Then, the microwaves 92 are transmitted through the quartz glass windows 36a and 36b into the inside of the etching chamber 31. Magnetic fluxes 91 of 875 Gauss are generated in the inside of the etching chamber 31 by the solenoid coils 35. Consequently, an ECR phenomenon takes place so that high density plasma bars 93 (93a, 93b) are generated along and in parallel to the sides 72 and 73 of the rectangular substrate 71. The high density plasma 93 in this instance may otherwise be generated in the form of plates along the side walls 34a and 34b of the etching chamber 31.

Diffusion plasma 94 is generated by diffusion components (diffusion charged particles or radicals) of the high density plasma 93 generated in such a manner as described above such that it covers over the rectangular substrate 71. A high frequency of 2 MHz is applied to the rectangular substrate 71 so that charged particles in the diffusion plasma 94 are attracted to the rectangular substrate 71 thereby to effect anisotropic etching of the rectangular substrate 71.

In the apparatus described above, since the high density plasma 93 is generated by an ECR phenomenon, the controllability of etching is high. Consequently, etching can be performed at a high selectivity ratio at a high etching rate.

Further, even if the pressure of the etching ambient atmosphere in the etching chamber 31 is low, the high density plasma 93 can be generated with stability.

Furthermore, since the high density plasma 93 does not contact directly with the rectangular substrate 71, no etching damage is provided to the rectangular substrate 71.

Exemplary processing conditions when various thin films are etched with the ECR plasma etching apparatus 2 described above are similar to those described hereinabove in connection with the rectangular substrate dry etching apparatus 1 of the first embodiment, and accordingly, description thereof is omitted herein to avoid redundancy.

Having now fully described the invention, it will be apparent to one of ordinary skill in the art that many changes and modifications can be made thereto without departing from the spirit and scope of the invention as set forth herein.

What is claimed is:

1. A dry etching apparatus for dry etching a rectangular substrate, comprising:

an etching chamber having a parallelpiped shaped with a pair of side walls extending parallel to each other and connected together by a pair of end walls;

means for holding a rectangular substrate to be etched in position in said etching chamber; and a plasma generator disposed in said etching chamber for generating a pair of high density plasma bars adjacent the pair of side walls and on the outer sides of and substantially in parallel to a pair of opposing sides of the rectangular substrate in said etching chamber so as to etch the rectangular substrate with diffusion components of the high density plasma bars.

2. A dry etching apparatus according to claim 1, wherein said plasma generator generates high density plasma by magnetron discharge of the compressing magnetic field type.

3. A dry etching apparatus according to claim 1, wherein said plasma generator generates high density plasma by electron cyclotron resonance.

4. A dry etching apparatus according to claim 1, further comprising a high frequency bias applying apparatus for applying a high frequency of 2 to 13.56 MHz to the rectangular substrate.

5. A dry etching apparatus according to claim 4, wherein the power source for said plasma generator and the power source for said high frequency bias applying apparatus are independent of each other.

6. A dry etching apparatus according to claim 1, wherein the length of the high density plasma bars generated by said plasma generator is greater than the length of the opposing pair of sides of the rectangular substrate.

7. A dry etching apparatus according to claim 1, wherein said plasma generator generates a plurality of pairs of high density plasma bars.

8. A dry etching apparatus according to claim 1, wherein the high density plasma bars generated by said plasma generator are spaced away from the rectangular substrate.

9. A dry etching apparatus according to claim 1, wherein the diffusion components of the high density plasma generated by said plasma generator are formed from diffusion charged particles and diffusion radicals.

10. A dry etching apparatus according to claim 1, further comprising a substrate transporting mechanism including a gate valve and a load locking chamber disposed on the outer side of one of the end walls of the chamber.

* * * * *